(12) United States Patent
Han et al.

(10) Patent No.: US 9,502,365 B2
(45) Date of Patent: Nov. 22, 2016

(54) OPENING IN A MULTILAYER POLYMERIC DIELECTRIC LAYER WITHOUT DELAMINATION

(71) Applicant: Texas Instruments Incorporated, Dallas, TX (US)

(72) Inventors: Licheng Marshal Han, Firsco, TX (US); Michael Andrew Serafin, Richardson, TX (US); Byron Williams, Plano, TX (US); Sandra Rodriguez Varela, Allen, TX (US); Salvatore Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/576,784

(22) Filed: Dec. 19, 2014

(65) Prior Publication Data

US 2015/0187711 A1 Jul. 2, 2015

Related U.S. Application Data

(60) Provisional application No. 61/922,397, filed on Dec. 31, 2013.

(51) Int. Cl.
| | |
|---|---|
| *H01L 21/4763* | (2006.01) |
| *H01L 23/00* | (2006.01) |
| *H01L 23/31* | (2006.01) |
| *H01L 23/532* | (2006.01) |
| *H01L 49/02* | (2006.01) |
| *H01L 21/768* | (2006.01) |
| *H01L 21/784* | (2006.01) |
| *H01L 23/522* | (2006.01) |

(52) U.S. Cl.
CPC ......... *H01L 24/05* (2013.01); *H01L 21/76801* (2013.01); *H01L 21/76802* (2013.01); *H01L 23/3192* (2013.01); *H01L 23/5329* (2013.01); *H01L 23/53295* (2013.01); *H01L 28/10* (2013.01); *H01L 21/784* (2013.01); *H01L 23/5227* (2013.01); *H01L 2224/05567* (2013.01); *H01L 2224/94* (2013.01); *H01L 2924/14* (2013.01); *H01L 2924/19042* (2013.01); *H01L 2924/19104* (2013.01); *H01L 2924/35121* (2013.01)

(58) Field of Classification Search
CPC ................... H01L 21/76829–21/76834; H01L 21/76802–21/76807
USPC ........................................................ 438/639
See application file for complete search history.

(56) References Cited

U.S. PATENT DOCUMENTS

| | | | | |
|---|---|---|---|---|
| 4,980,270 | A * | 12/1990 | Inasaka | H05K 3/0023 430/312 |
| 5,135,606 | A * | 8/1992 | Kato | H01L 21/486 205/135 |
| 6,737,222 | B2 * | 5/2004 | Subramanian | G03F 7/0035 257/E21.027 |
| 8,736,050 | B2 * | 5/2014 | Huang | H01L 24/81 257/621 |
| 2002/0187638 | A1 * | 12/2002 | Nakagawa | H01L 21/0273 438/689 |
| 2004/0009663 | A1 * | 1/2004 | Yu | H01L 21/76804 438/674 |
| 2004/0175925 | A1 * | 9/2004 | Park | H01L 21/76831 438/623 |
| 2013/0241049 | A1 * | 9/2013 | Yu | H01L 23/585 257/737 |

(Continued)

*Primary Examiner* — Joshua King
(74) *Attorney, Agent, or Firm* — Jacqueline J. Garner; Frank D. Cimino

(57) ABSTRACT

An integrated circuit and method with a delamination free opening formed through multiple levels of polymer dielectric. The opening has a vertical sidewall and no interface between adjacent levels of polymer dielectric is exposed on the vertical sidewall.

17 Claims, 5 Drawing Sheets

(56) References Cited

U.S. PATENT DOCUMENTS

2014/0084464 A1* 3/2014 Chen ............... H01L 23/53295
　　　　　　　　　　　　　　　　　　　　　　257/741

2014/0151698 A1* 6/2014 Chen ................ H01L 22/34
　　　　　　　　　　　　　　　　　　　　　　257/48

* cited by examiner

OPENING IN A MULTILAYER POLYMERIC DIELECTRIC LAYER WITHOUT DELAMINATION

CROSS-REFERENCE TO RELATED APPLICATIONS

This application claims the benefit of priority under U.S.C. §119(e) of U.S. Provisional Application 61/922,397, filed Dec. 31, 2013), the contents of which are hereby incorporated by references.

FIELD OF INVENTION

This invention relates to the field of integrated circuits. More particularly, this invention relates to polymeric dielectric layers in integrated circuits.

BACKGROUND

Integrated circuits that include such devices as capacitors, inductors, and transformers often use multiple levels of polymeric dielectrics such as polyimides and photosensitive polyimides to provide electrical isolation. High voltage applications require thick layers of the polymeric dielectric to provide reliable isolation.

Polymeric materials shrink when cured. Thick polymeric layers may delaminate when cured due to stresses created by the shrinkage during the cure. To reduce delamination, thick layers of polymeric dielectric may be formed by repeated polymer dielectric deposition and cure cycles. While this may significantly reduce delamination it may not be eliminated.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method with a delamination free opening formed through multiple levels of polymer dielectric. The opening has a vertical sidewall and no interface between adjacent levels of polymer dielectric is exposed on the vertical sidewall.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It has been discovered that delamination between multiple layers of polymer dielectric may be eliminated by avoiding the formation on an exposed interface between two layers of polymer dielectric on a vertical surface. For example, if an interface is exposed on the sidewall of a contact opening, on the sidewall of a bondpad opening, or on the sidewall of a scribe seal, delamination may occur at the interface.

In a first embodiment the upper polymer dielectric layer may overlap the lower dielectric layer so that the edge of the lower polymer dielectric layer is covered with the upper dielectric layer. In a second embodiment, the edge of an upper layer of polymer dielectric may be pulled back (stair stepped) away from the edge of the lower polymer dielectric so the interface is no longer exposed on a vertical surface.

Figure 1A:
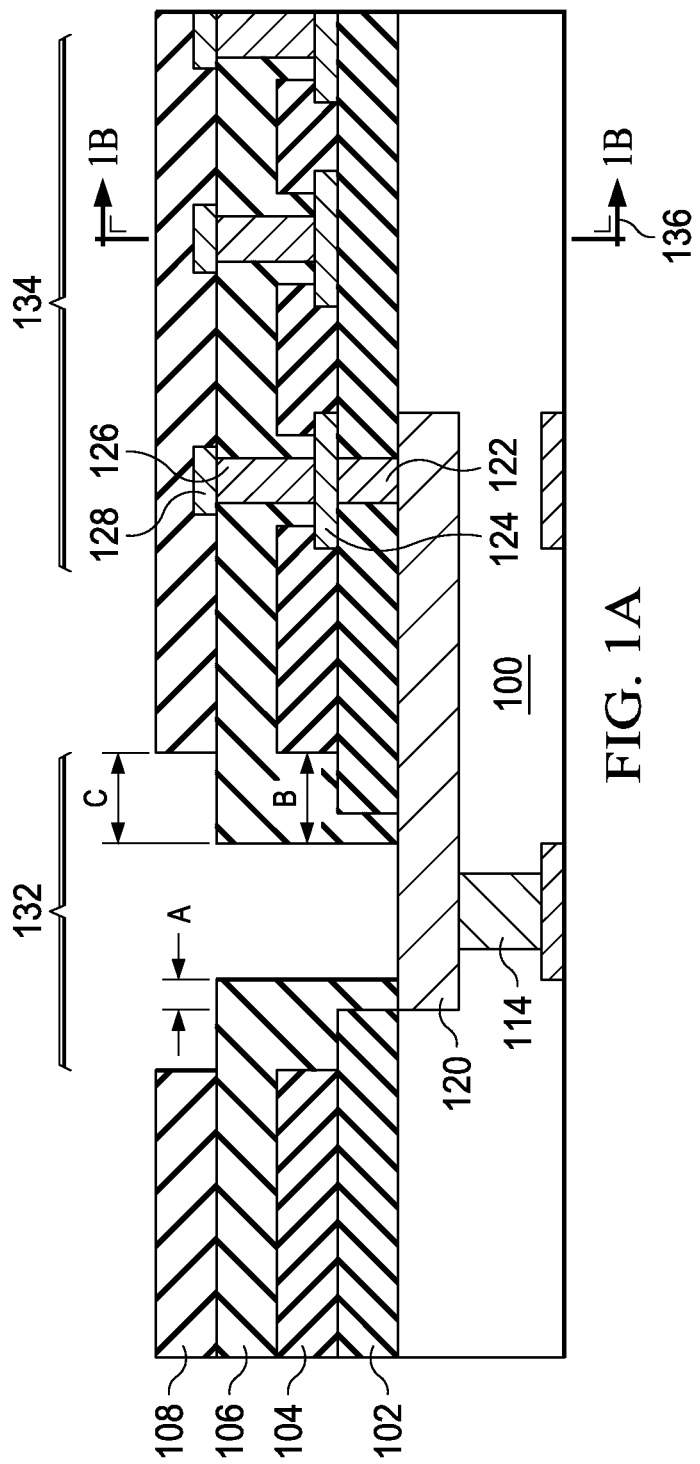
FIGS. 1A and 1B are cross-sections of an integrated circuit with a contact formed through multiple levels of a polymeric dielectric according to principles of the invention.
Figure 1B:
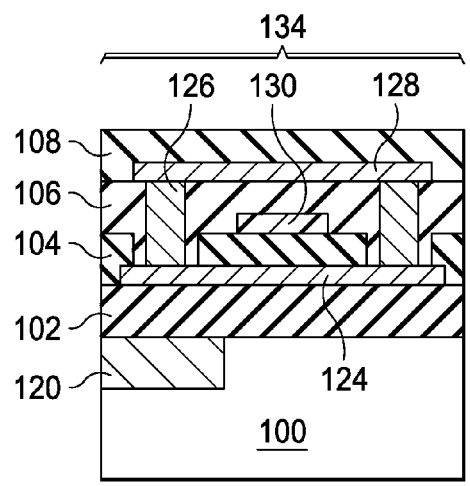

An inductor formed using multiple polymer dielectric layers 102, 104, 106, and 108 illustrates both embodiments in FIGS. 1A and 1B. FIG. 1B shows a cross section through the inductor core 130 along cut line 136 in FIG. 1A. Interfaces (ie. between polymer dielectric layers 102 and 104, between polymeric layers 104 and 106, and between polymeric layers 106 and 108) which would be exposed on the vertical sidewalls in contact opening 132 using a conventional process are avoided.

First polymeric layer 102 is spaced from the contact opening 132 by a distance A. Second polymeric layer 104 which is formed on top of layer 102 is spaced from the contact opening in layer 102 by a distance B. Distance B is larger than distance A so the edge of second polymer layer 104 is stair stepped away from the contact opening 132 on top of first polymer 102 by a distance equal to B minus A. Third polymeric layer 106 is formed over layers 102 and 104, and covers the edges of underlying layers 104 and 102 in the contact opening 132. The third polymer layer 106 covers the interfaces between dielectric layers 104 and 102 and between dielectric layer 102 and the substrate 100. The contact opening 132 is formed in the third dielectric layer 106 so only the third dielectric is exposed on the vertical sidewalls of the contact opening 132. By avoiding exposure of the interfaces between layers 102 and 104 and between layers 104 and 106 in the contact opening 132, delamination is avoided.

Also shown in FIG. 1A the edge of top polymeric layer 108 which is formed on layer 106 is spaced from the edge of the contact opening 132 by a distance C. This avoids delamination at the interface between layer 108 and 106 which might occur if the opening in polymer dielectric layer 108 were the same size as the contact opening in polymeric dielectric layer 106 so that the interface between polymeric layers 108 and 106 would be exposed on the sidewall of the contact opening 132.

The inductor 134 used to illustrate an integrated circuit with multiple polymer dielectric layers 102, 104, 106, 108 consists of a metal inductor coil which surrounds a magnetic core 130 (FIG. 1B). The metal inductor coil is formed with bottom metal leads 124 and top metal leads 128 which are connected together by metal posts 126 to form the inductor coil. The bottom leads 124 of the inductor coil are electrically isolated from the underlying interconnect 120 by first polymeric dielectric layer 102. The inductor core 106 is electrically isolated from the bottom metal leads 124 by second polymer dielectric layer 104 and from the top metal leads 128 by third polymer dielectric layer 106. The metal posts 126 which connect the bottom metal leads 124 to the top metal leads 128 to form the inductor coil are formed in openings through polymer dielectric layers 104 and 106. The metal posts 126 are also electrically isolated from the inductor core 106 by polymer dielectric layers 104 and 106. A fourth polymer dielectric layer 108 is formed on top the top metal leads 128 to protect them from the environment.

The example IC in FIGS. 1A and 1B illustrate methods of forming a contact opening in 4 levels of polymer dielectric that avoids delamination at the interfaces between the multiple layers of the polymer dielectric.

Figure 2:
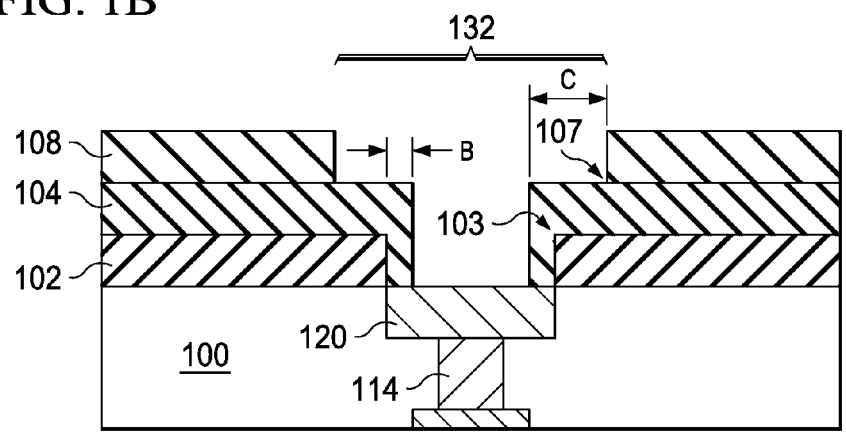
FIG. 2 is a cross-section of an integrated circuit with a contact formed through multiple levels of a polymeric dielectric according to principles of the invention.

An integrated circuit with 3 levels of polymer dielectric 102, 104, and 108 is illustrated in FIG. 2. In this example a contact opening in bottom first polymer dielectric layer 102 is larger than the contact opening 132 by a distance B. Second polymer dielectric layer 104 is formed on top of the first polymer dielectric layer 102. Contact opening 132 is formed in the second polymer dielectric layer 104 inside the contact opening in the first polymer dielectric layer 102. The edges of the first polymer dielectric layer 102 are covered with overlying second polymer dielectric layer within the contact. This prevents the interface edge 103 between the first polymer dielectric layer 102 and second polymer dielectric layer 104 from being exposed within the contact opening. This avoids delamination at this interface 103.

A third polymer dielectric layer 108 is formed on the second polymer dielectric layer 104 with a contact opening in the third polymer dielectric layer 108 that is larger than the IC contact opening 132 by a distance C. Design rule C prevents the edges of the contact opening in the third polymer dielectric layer 108 from being collinear with the edge of polymeric dielectric layer 104 within the integrated circuit (IC) contact opening 132. This avoids delamination at this interface 107.

Figure 3:
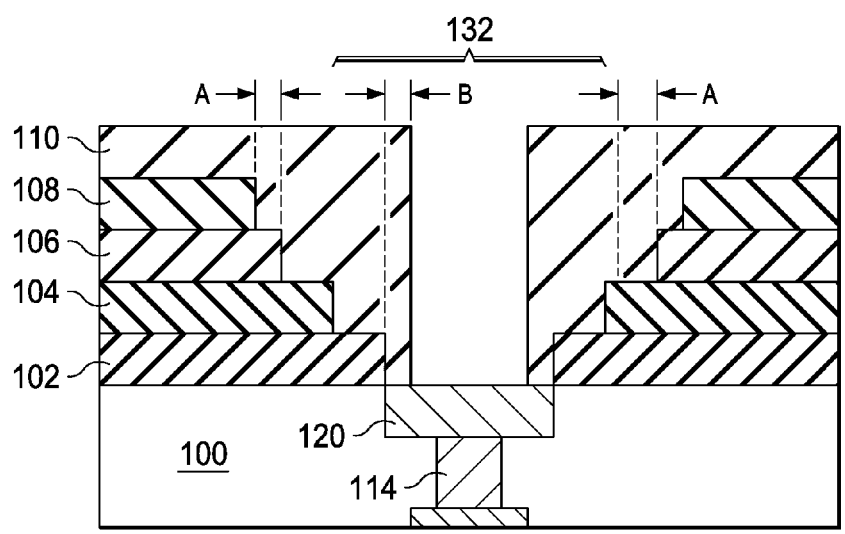
FIG. 3 is a cross-section of an integrated circuit with a contact formed through multiple levels of a polymeric dielectric according to principles of the invention.

An example with five polymeric dielectric layers, 102, 104, 106, 108, and 110 is illustrated in FIG. 3. In this example the IC contact 132 is formed through a single polymeric dielectric layer 110 which overlies the edges of the other dielectric layers 102, 104, 106, and 108 below it. The edges of the underlying dielectric layers 108, 106, 104, and 102 are stair stepped away from the IC contact 132 opening. The distance of each stair step may be the same or may be different. Polymer layer 110 is deposited over the underlying dielectric layers 108, 106, 104, 102 filling the contact openings in the underlying layers and covering the edges of the underlying layers. IC contact 132 which is smaller in diameter than the contact openings in each of the underlying dielectric layers 108, 106, 104, and 102 is formed to the underlying interconnect 120. The interface edges between the underlying polymer dielectric layers, 108, 106, 104, and 102 are covered by overlying polymer dielectric 110. IC contact 132 is formed through polymer dielectric layer 110 only so no interfaces are exposed on the sidewalls of the IC contact 132. This prevents delamination at the interfaces.

Figure 4:
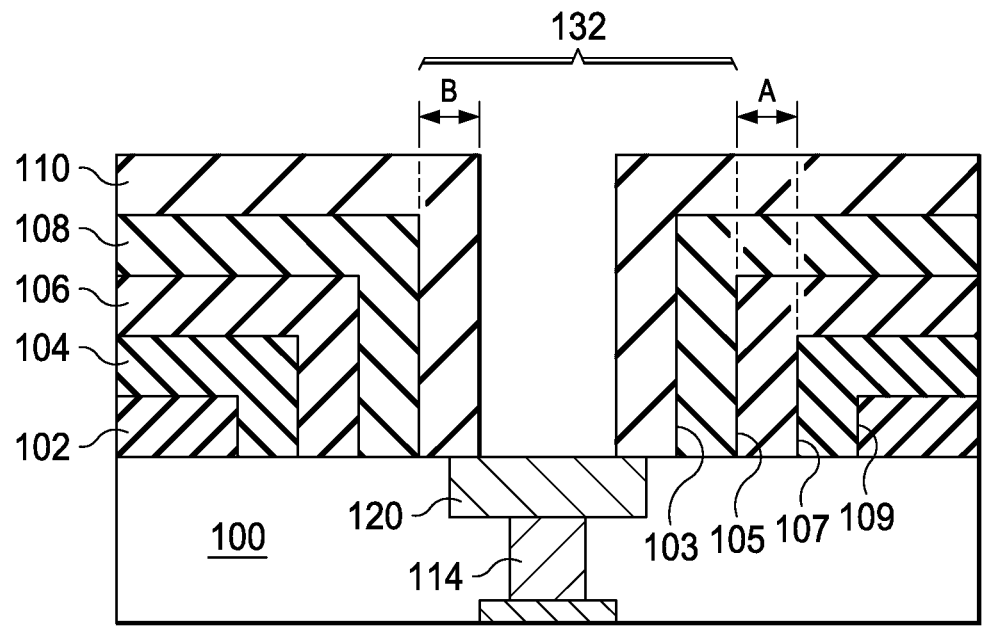
FIG. 4 is a cross-section of an integrated circuit with a scribe seal formed through multiple levels of a polymeric dielectric according to principles of the invention.

Another polymeric dielectric layer overlap structure with five layers of polymer dielectric is illustrated in FIG. 4. In this structure each overlying polymeric dielectric layer overlaps and covers the edge of the polymeric dielectric layer beneath it. Polymeric dielectric layer 104 covers the edge 103 of underlying polymeric dielectric layer 102. Polymeric dielectric layer 106 covers the edge 105 of underlying polymer dielectric layer 104. Polymeric dielectric layer 108 covers the edge 107 of underlying polymer dielectric layer 106. Polymeric dielectric layer 110 through which the contact 132 is formed covers the edge 109 of underlying polymer dielectric layer 108. Each overlying polymeric dielectric layer overlaps the edge of the underlying polymeric dielectric layer. The IC contact 132 is formed in polymeric dielectric 110. No interface edges are exposed on the vertical sidewalls of the IC contact 132 so no interface delamination may occur.

Figure 5:
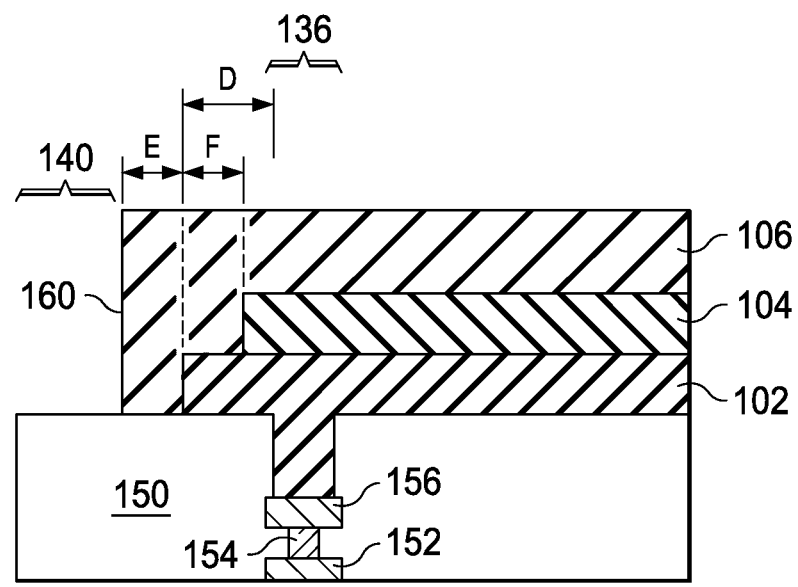
FIG. 5 is a cross-section of an integrated circuit with a scribe seal formed through multiple levels of a polymeric dielectric according to principles of the invention.

A delamination free scribe seal overcoat for integrated circuits with three levels of polymeric dielectric, 102, 104, and 106 is illustrated in FIG. 5. The scribe seal typically is comprised of a trench that is formed through multiple layers of dielectric 150 at the die edge and is filled with layers interconnect metal 152 and 156 and with contact and via metal 154. The scribe seal 136 is typically formed adjacent to the scribe lane 140. The edges of the four layers of polymeric dielectric are staggered or stair stepped so no interface edge is exposed on the edge 160 of the scribe seal.

Design rule D specifies the minimum distance the first (bottom) layer of polymeric dielectric 102 overlaps the scribe seal 136 in the direction of the scribe lane 140. In this example, the second layer of polymer dielectric 104 is stair stepped away from the scribe lane 140 by a distance F so the edge of the second layer of polymer dielectric 104 is not coincident with the edge of the first layer of polymer dielectric 102 to avoid delamination of the interface. The third layer of polymer dielectric 106 covers the edges of underlying polymer dielectric layers 104 and 106 forming a scribe seal edge of polymer dielectric 106 only. The third layer of polymer dielectric 106 overlaps the edge of the first polymer dielectric layer by a distance E. Distances D, E, and F may be the same or may be different.

The polymeric dielectric may be a spin-on photosensitive polymer such as polyimide, polybenzobisoxazole (PBO), SU-8 (epoxy-based photosensitive polymer), or BCB (benzocyclobutene-based photosensitive polymer). A photosensitive polyimide is used to illustrate the embodiment.

An example process for forming an IC contact in an integrated circuit with multiple levels of polymeric dielectric is illustrated in FIGS. 6A through 6E. An integrated circuit 100 with 4 levels of photosensitive polyimide is used to illustrate the process. A delamination free IC contact 132 is formed through 4 levels of photosensitive polyimide to a metal lead or bond pad 120 on an underlying integrated circuit 100.

Figure 6A:
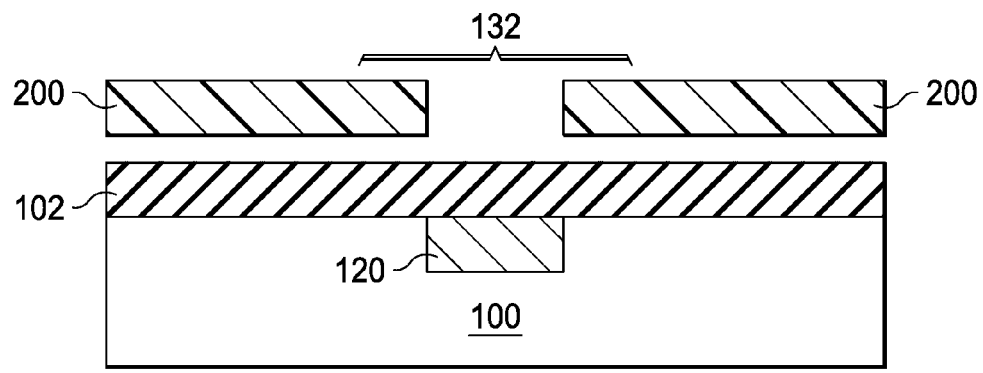
FIGS. 6A-6E are illustrations of steps in the fabrication of integrated circuits formed according to principles of the invention.

In FIG. 6A, a first photosensitive polyimide layer 102 is deposited over a bond pad 120 on an underlying integrated circuit 100. Using photo mask 200 a first contact opening is exposed in the first photosensitive polyimide layer 102.

Figure 6B:
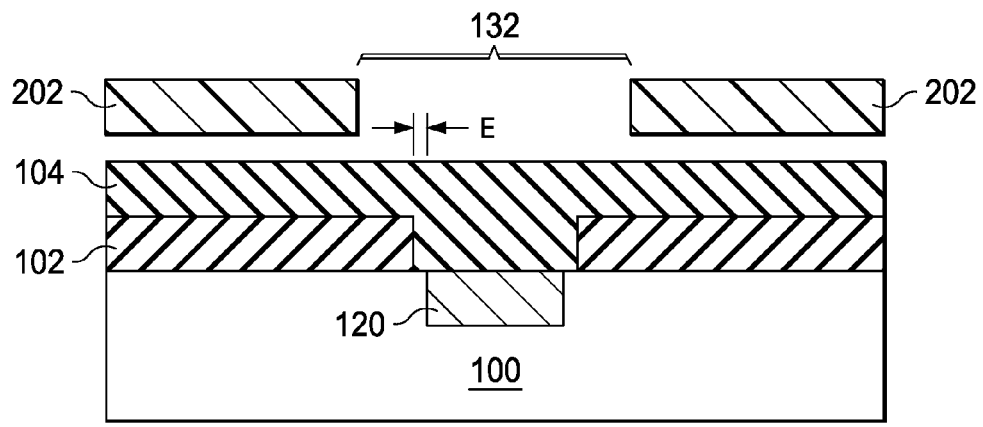

The first photosensitive polyimide layer 102 is then developed to form a first contact opening as illustrated in FIG. 6B. The first contact opening overlaps the underlying metal pad 120 by a distance E. The first photosensitive polyimide layer 102 is then cured by baking it at a temperature of about 400° C. for a time of about 60 min producing a final thickness of about 5 to 20 um.

FIG. 6B shows the integrated circuit 100 after a second photosensitive polyimide layer 104 is spin coated on the integrated circuit 100. A second contact opening is then exposed in the second photosensitive polyimide layer 102 using photo mask 202.

Figure 6C:
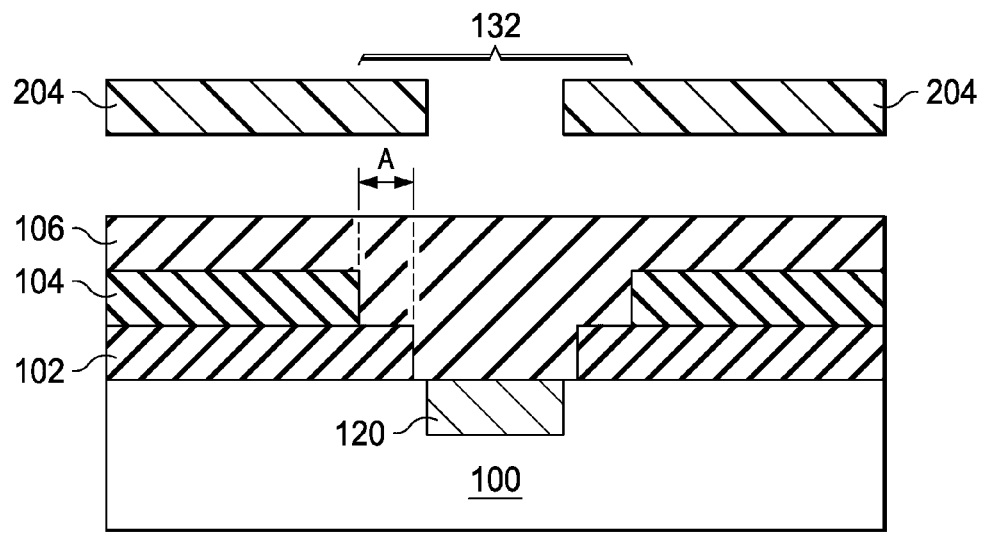

The second photosensitive polyimide layer 104 is developed after exposure to form the second contact as shown in FIG. 6C. The second contact opening is concentric with the first contact opening and larger than the first contact so the edge of the second polymer layer is stair stepped away from the first contact opening. A design rule A may be used to specify the distance the edge of the second photosensitive polyimide layer 104 is stair stepped back from the edge of the first contact opening. The second photosensitive polyimide layer 104 is then cured by baking it at a temperature of about 400° C. for a time of about 60 min producing a final thickness of about 5 to 20 um.

Referring again to FIG. 6C, a third layer 106 of photosensitive polyimide in which the IC contact 132 is to be formed may be deposited. The third layer of photosensitive polyimide 106 (IC contact layer) is deposited using spin-on coating after the second photosensitive polyimide layer 104 is exposed, developed, and cured. IC contact opening 132 is then exposed in the polyimide IC contact layer 106 using photo mask 204.

Figure 6D:
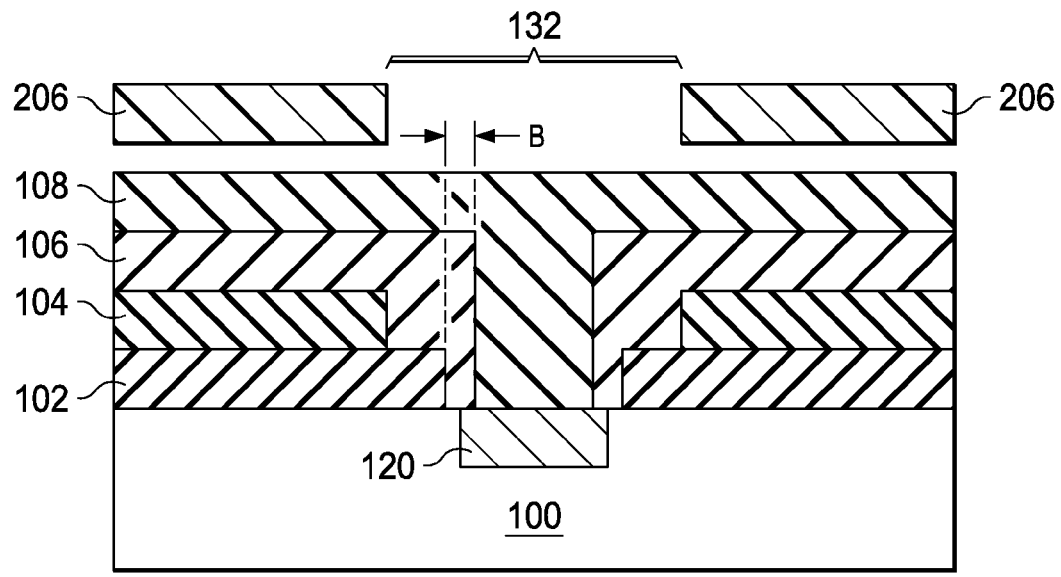

The IC contact opening 132 is smaller than the first and second contact openings so that after develop as shown in FIG. 6D the third photosensitive polyimide layer 106 overlaps the first 102 and second 104 photo sensitive polyimide layers within the first and second contact openings. A design rule B may specify the distance the third photosensitive polyimide layer 106 overlaps the first photosensitive polyimide layer 102 inside the first contact opening. The IC contact 132 is formed through the third photosensitive polyimide layer 106 only. No interfaces between photosensitive polyimide layers 102, 104, and 106 are exposed in the sidewalls of the IC contact 132. This avoids delamination that otherwise may occur when polymeric dielectric interfaces are exposed on the sidewall of an IC contact opening or on the sidewall of any other opening through multiple levels of polymeric dielectric. The third photosensitive polyimide layer 106 is then cured by baking it at a temperature of about 400° C. for a time of about 60 min producing a final thickness of about 5 to 20 um.

As shown in FIG. 6D a fourth layer of photosensitive polyimide 108 may be formed on the third photosensitive polyimide layer 106 and IC contact 132. The fourth layer of photosensitive polyimide may be added to provide additional protection to the integrated circuit during subsequent processing steps such as dicing and packaging. A fourth contact opening is exposed in the fourth photosensitive polyimide layer 108 using photo mask 206. The fourth contact opening is larger than the IC contact opening 132.

Figure 6E:
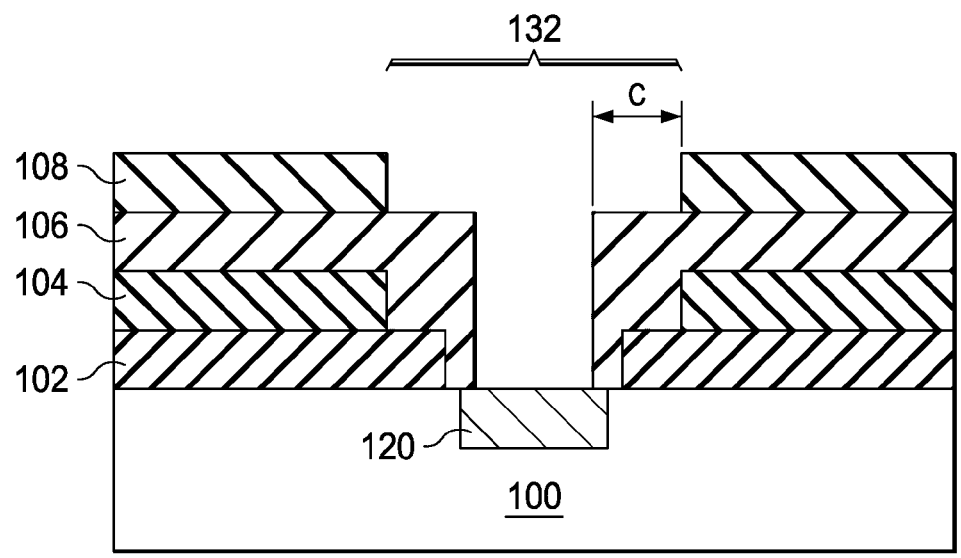

As shown in FIG. 6E, the fourth photosensitive polyimide layer 108 may then developed to form the fourth contact opening. The fourth contact opening is larger than the IC contact 132 so that the edge of the fourth photosensitive polyimide layer 108 is stair stepped away from the IC contact 132 by a distance C. This prevents the edge of the fourth photosensitive polyimide layer from being coincident with the edge of the third photosensitive polyimide layer 106 in the IC contact 132. This avoids delamination between the third photosensitive polyimide layer 106 and the fourth photosensitive polyimide passivation layer 108 which may occur if an interface between the two layers 106 and 108 is exposed on the sidewall within the IC contact opening 132. The fourth photosensitive polyimide layer 108 is then cured by baking it at a temperature of about 400° C. for a time of about 60 min producing a final thickness of about 5 to 20 um.

Those skilled in the art to which this invention relates will appreciate that many other embodiments and variations are possible within the scope of the claimed invention. For example how the invention relates to fewer or more levels of polymeric dielectric layers and how the invention relates to other types of openings through the multiple dielectric layers such as scribe seals or probe openings.

What is claimed is:

1. A process of forming an integrated circuit, comprising the steps:
    coating the integrated circuit with a first layer of a photosensitive polymer dielectric;
    exposing a first opening in the first layer using a first opening photo mask;
    developing the first layer to form the first opening with a first layer edge;
    curing the first layer;
    coating the integrated circuit with an overlying layer of a photosensitive polymer dielectric;
    exposing an IC opening in the overlying layer of photosensitive polymer layer using an IC opening photomask;
    developing the overlying layer of photosensitive polymer to form an IC opening;
    curing the overlying layer;
    coating the integrated circuit with a second layer of a photosensitive polymer dielectric;
    exposing a second opening in the second layer of photosensitive polymer layer using a second opening photomask;
    developing the second layer of photosensitive polymer to form the second opening;
    wherein the IC opening and the first opening are concentric;
    wherein the IC opening is smaller than the first opening; and
    wherein the overlying layer covers the first layer edge.

2. The process of claim 1, wherein:
    the second layer overlies the first layer and the overlying layer overlies the second layer;
    the second opening is larger than the first opening and wherein the second opening and the first opening are concentric;
    the second layer is stair stepped away from the first layer edge; and
    the overlying layer covers the second layer edge.

3. The process of claim 1, wherein:
    the second layer overlies the first layer and underlies the overlying layer;
    the second opening is larger than the IC opening and the second opening is smaller than the first opening and wherein the second opening and the first opening are concentric;
    the second layer covers the first layer edge; and
    wherein the overlying layer covers the second layer edge.

4. The process of claim 1, wherein the IC opening is an IC bondpad opening.

5. The process of claim 1, wherein the IC opening is a scribe seal opening.

6. The process of claim 1, wherein the photosensitive polymer dielectric a photosensitive polymer such as polyimide, polybenzobisoxazole (PBO), SU-8 (epoxy-based photosensitive polymer), or BCB (benzocyclobutene-based photosensitive polymer).

7. The integrated circuit of claim 1, wherein the photosensitive polymer dielectric is a photosensitive polyimide.

8. The process of claim 1, wherein:
the second layer overlies the first layer and the overlying layer;
the second opening is larger than the IC opening; and
the second opening and the first opening are concentric.

9. The process of claim 1, further comprising:
coating the integrated circuit with a third layer of a photosensitive polymer dielectric wherein the third layer overlies the first layer, the second layer, and the overlying layer;
exposing a third opening in the third layer using a third opening photo mask, wherein the third opening is larger than the IC opening and the first opening and wherein the third opening and the first opening are concentric;
developing the third layer to form the third opening with a third layer edge;
curing the third layer;
wherein the third layer is stair-stepped from the IC opening.

10. A process of forming an integrated circuit, comprising the steps:
coating the integrated circuit with a first layer of a photosensitive polymer dielectric;
forming a first opening with a first layer edge in the first layer;
curing the first layer;
coating the integrated circuit with a second layer of a photosensitive polymer dielectric wherein the second layer overlies the first layer;
forming a second opening with a second layer edge in the second layer;
curing the second layer;
coating the integrated circuit with an overlying layer of a photosensitive polymer dielectric, wherein the overlying layer overlies both the first layer and the second layer;
forming an IC opening in the overlying layer; and
curing the overlying layer;
wherein the IC opening and the first opening are concentric;
wherein the IC opening is smaller than the first opening and the second opening;
wherein the second layer is stair stepped away from the first layer edge; and
wherein the overlying layer completely covers the first layer edge and the second layer edge.

11. The process of claim 10, further comprising:
coating the integrated circuit with a third layer of a photosensitive polymer dielectric wherein the third layer overlies the first layer, the second layer, and the overlying layer;
exposing a third opening in the third layer using a third opening photo mask, wherein the third opening is larger than the IC opening and the first opening and wherein the third opening and the first opening are concentric;
developing the third layer to form the third opening with a third layer edge;
curing the third layer;
wherein the third layer is stair stepped away from the IC opening.

12. The process of claim 10, wherein the photosensitive polymer dielectric a photosensitive polymer such as polyimide, polybenzobisoxazole (PBO), SU-8 (epoxy-based photosensitive polymer), or BCB (benzocyclobutene-based photosensitive polymer).

13. The integrated circuit of claim 10, wherein the photosensitive polymer dielectric is a photosensitive polyimide.

14. A process of forming an integrated circuit, comprising the steps:
coating the integrated circuit with a first layer of a photosensitive polymer dielectric;
forming a first opening with a first layer edge in the first layer;
curing the first layer;
coating the integrated circuit with an overlying layer of a photosensitive polymer dielectric;
forming an IC opening in the overlying layer;
curing the overlying layer;
coating the integrated circuit with a second layer of a photosensitive polymer dielectric wherein the second layer overlies the first layer;
forming a second opening with a second layer edge in the second layer, wherein the second opening is larger than the IC opening and wherein the second opening is smaller than the first opening and wherein the second opening and the first opening are concentric; and
curing the second layer;
wherein the IC opening and the first opening are concentric;
wherein the IC opening is smaller than the first opening;
wherein the second layer covers the first layer edge; and
wherein the overlying layer covers the second layer edge.

15. The process of claim 14, further comprising:
coating the integrated circuit with a third layer of a photosensitive polymer dielectric wherein the third layer overlies the first layer and the second layer and wherein the overlying layer overlies the third layer;
exposing a third opening in the third layer using a third opening photo mask, wherein the third opening is larger than the IC opening and smaller than the first opening and the second opening;
developing the third layer to form the third opening with a third layer edge;
curing the third layer;
wherein the third layer overlies the second layer edge; and
wherein the third opening and the first opening are concentric.

16. The process of claim 14, wherein the photosensitive polymer dielectric a photosensitive polymer such as polyimide, polybenzobisoxazole (PBO), SU-8 (epoxy-based photosensitive polymer), or BCB (benzocyclobutene-based photosensitive polymer).

17. The integrated circuit of claim 14, wherein the photosensitive polymer dielectric is a photosensitive polyimide.

* * * * *